United States Patent
van der Kolk et al.

(10) Patent No.: US 6,767,617 B2
(45) Date of Patent: Jul. 27, 2004

(54) METHOD FOR THE MANUFACTURE OF AN ARTICLE AND AN ARTICLE

(75) Inventors: Gerrit Jan van der Kolk, RG Maarheeze (NL); Antonius P.A. Hurkmans, Taylorsville, NC (US); Christian G.C. Strondl, CM Venlo (NL)

(73) Assignee: Hauzer Techno Coating Europe BV, AE Venlo (NL)

( * ) Notice: Subject to any disclaimer, the term of this patent is extended or adjusted under 35 U.S.C. 154(b) by 0 days.

(21) Appl. No.: 09/779,115

(22) Filed: Feb. 7, 2001

(65) Prior Publication Data

US 2002/0182448 A1 Dec. 5, 2002

(30) Foreign Application Priority Data

Feb. 9, 2000 (DE) .......................... 100 05 612

(51) Int. Cl.⁷ .................. C23C 14/22; B32B 9/00
(52) U.S. Cl. ............... 428/216; 428/212; 428/336; 428/469; 428/472; 428/408; 428/698; 428/704
(58) Field of Search .................. 428/212, 216, 428/336, 408, 469, 472, 698, 704

(56) References Cited

U.S. PATENT DOCUMENTS

| | | | |
|---|---|---|---|
| 3,895,156 A | | 7/1975 | Hammond |
| 4,731,302 A | * | 3/1988 | Weissmantel et al. |
| 5,490,911 A | | 2/1996 | Makowiecki |
| 5,928,771 A | * | 7/1999 | DeWald, Jr. et al. |

FOREIGN PATENT DOCUMENTS

| | | |
|---|---|---|
| DE | 19826259 A1 | 12/1998 |
| DE | 19816491 A1 | 10/1999 |
| EP | 0 179 582 * | 4/1986 |
| EP | 0579983 A1 | 1/1994 |
| EP | 0724023 A1 | 7/1996 |
| EP | 0592986 B1 | 7/1998 |
| EP | 0971048 A1 | 1/2000 |
| GB | 2179678 * | 3/1987 |
| GB | 2303380 | 2/1997 |
| GB | 2331998 A | 6/1999 |
| WO | WO 99/55929 A1 | 11/1999 |

OTHER PUBLICATIONS

Onate et al "Deposition of hydrogenated B–C thin films and their mechanical and chemical characterization" Surface & Coating Technology, 49 (199) 548–553.*
D. Repenning, "MeC:CH–coatings produced by arc–ion–plating process" Le Vide: Science, Technique et Applications, FR SFV, vol. 51 (276), pp. 197–209, Apr. 1, 1995.
J. T. Hamack, et al; "Characterisation of the AG–C : H deposition process" Diamond and Related Materials, NL, Elsevier Science Publishers, Amsterdam, vol. 1 (2–04), pp. 301–306.

* cited by examiner

Primary Examiner—Archene Turner
(74) Attorney, Agent, or Firm—Townsend and Townsend and Crew LLP

(57) ABSTRACT

A method for the manufacture of an article having first and second surface regions of different coefficients of friction in a treatment chamber with a rotary support for the articles and capable of simultaneously carrying out at least two PVD coating processes. The first PVD coating process is carried out with a comparatively directed vapor flux from one or more targets which can compose one or more of the elements B, Si, Ti, V, Cr, Zr, Nb, Mo, Hf, Ta and W, carbides of these elements and carbon. A second PVD coating process is carried out with a comparatively less directed or non-directed vapor flux of carbon.

18 Claims, 8 Drawing Sheets

Thicker coating of, for example, $B_4C$-C:H with 80 at% B

Thinner coating of, for example, $B_4C$-C:H with 55 at% B

Bonding layer of Cr or Ti

FIG. 13

Thicker coating of, for example, WC-C:H

Bonding layer of Cr or Ti

Alternating layer sequence of WC/C or WC/C-H with WC layers of 1-3nm and C or C-H layers of 1-20nm

US 6,767,617 B2

METHOD FOR THE MANUFACTURE OF AN ARTICLE AND AN ARTICLE

BACKGROUND OF THE INVENTION

The present invention relates to a method for the manufacture of an article having a first and a second surface region of different coefficients of friction using a treatment chamber suitable for the carrying out of PVD processes.

The invention is concerned with a new concept belonging to the invention to the effect that it must be possible to provide a relatively high coefficient of friction on a first surface region and a relatively low coefficient of friction on a second surface region by means of a PVD process at a reasonable cost.

Examples for applications where such a process could be useful are, for example:

- links of driving chains which are installed in infinitely variable drives;
- bearings which should have a high coefficient of friction on the outside so that they can be held in a housing without slipping, but which should have a lower coefficient of friction on the inside so that they can provide the journalling of a shaft or another component with extremely low wear properties; and
- fastener elements and washers for fastener elements. For example, a washer for a nut should have a higher coefficient of friction on the surface facing the component so that the washer does not turn on the component and damage the component when the nut is tightened, while the coefficient of friction for the pair washer/nut should be small so that the nut can be properly tightened, for which a relative rotary movement is required between the nut and the stationary washer.

SUMMARY OF THE INVENTION

In order to satisfy this object, the initially named method is characterized in accordance with the invention by at least two PVD coating processes being carried out at the same time in the treatment chamber, with the first PVD coating process being carried out with a comparatively directed vapor flux from one target or from a plurality of targets which can comprise one or more of the elements B, Si, Ti, V, Cr, Zr, Nb, Mo, Hf, Ta and W, carbides of the said elements and carbon and with the second PVD coating process being carried out with a comparatively less directed or non-directed vapor flux of carbon.

The invention is based on the recognition that carbides consisting of the said elements and carbon, in particular coatings with incorporated hydrogen, have a coefficient of friction which is dependent on the composition of the layer. For example, a coating $B_4C$—C:H with 55 atomic % of boron and consequently 45 atomic % of C:H has a coefficient of friction of 0.2, whereas the same coating with 80 atomic % of boron has a coefficient of friction of 0.9.

A composition-dependent coefficient of friction can be found in all these elements, although the exact compositions required to produce clearly different coefficients of friction differ in each case. For tungsten, for example, a composition of W—C:H with 50 at % W has a high coefficient of friction, whereas with 15 at % W and a consequently higher proportion of carbon a low coefficient of friction results.

As a result of the deposition of the carbide layer from a comparatively directed vapor flux, this coating is preferably effected on the surface region which is perpendicular to and facing the vapor flux, whereas a considerably thinner coating is formed on surfaces which are not perpendicular to the vapor flux, i.e. are not facing it.

By the carbon vapor flux being comparatively less directed or non-directed, i.e. de facto forming a carbon cloud, the carbon is present at all surface regions equally with an approximately constant distribution density. As the carbon on the first surface region mixes with a larger supply of carbide molecules, a coating with relatively little carbon is effected there, whereas a high carbon concentration is achieved on the second surface region where comparatively few molecules of the carbide are deposited due to the directed properties of the vapor flux.

Thus, different carbon contents are present on the two said surface regions which result in the different coefficients of friction on these surface regions desired in accordance with the invention.

While, strictly speaking, it is not necessary to provide any movements of the articles to carry out the method in accordance with the invention, particularly when only a single article is to be coated, it is, however, advisable for reasons of process economy and for the generation of a uniform coating to arrange the object or a plurality of objects on a rotary support in a manner known per se.

The two PVD coating processes can be realized in a variety of ways.

It is possible, for example, to carry out the two PVD coating processes by using a single PVD coating apparatus. To realize this, one proceeds such that a metal vapor or metal and carbide ions are generated with one or more targets using a cathode sputtering process or an arc discharge vaporization process and directed onto the article as a directed vapor flux, with the cathode sputtering process or the arc discharge vaporizing process resulting in or contributing to the generation of a plasma in the treatment chamber and thereby to the generation, from a hydrocarbon atmosphere present in the treatment chamber, of carbon ions and molecules in the form of a less directed or non-directed vapor flux, which is at least partially incorporated into the coating being formed on the article.

The carbon ions and molecules are thus generated in a plasma which is anyway present in the cathode sputtering mode or the arc discharge vaporization mode due to the operation of a cathode (target). This plasma can also be expanded by the use of selected magnetic fields in order to increase the supply of carbon ions and molecules and above all to bring it into the region of the article. The magnetic fields can also be the magnetic fields which are needed for the operation of the cathode as an imbalanced magnetron.

Another possibility of carrying out the two PVD coating processes is to use first and second PVD apparatuses in the treatment chamber, with the arrangement being able to be chosen so that at least a first PVD coating apparatus and a second PVD coating apparatus are used in the treatment chamber, with the first PVD coating apparatus generating a comparatively directed vapor flux from a target or a plurality of targets consisting of one or more of the elements B, Si, Ti, V, Cr, Zr, Nb, Mo, Hf, Ta and W, carbides of the said elements and carbon, and the second element generating a comparatively less directed or non-directed vapor flux of carbon.

To carry out the method in accordance with the invention in accordance with the first variant, the article or plurality of articles can be arranged on a rotary support and be moved through the comparatively directed vapor flux of the first PVD coating apparatus by a rotary movement of the support, with said rotary movement being either a simple rotary movement so that the article or each article has a given, at least substantially constant, effective orientation with respect to the said vapor flux, or a complex rotary movement, for example a rotary movement in which the article or each article is rotated around its own axis, with the individual rotary movements being synchronized in the case of a more complex rotary movement such that the article or each article also has a given, at least substantially constant, effective orientation with respect to the said vapor flux.

By the effective orientation of the article always being identical with respect to the directed vapor flow of the first PVD coating apparatus, the first surface region is preferably coated. By the vapor flux of carbon being less directed, it is present at all surface regions, whereby the different compositions of the first and second surface regions are created, as described above. The first PVD coating apparatus generating a comparatively directed vapor flux can be one or more of the following coating apparatuses:
an arc discharge vaporization device;
a cathode sputtering device, for example in the form of a magnetron or an imbalanced magnetron;
a linear ion source, in particular a source of this kind for the generation of carbon ions such as a plasma generating source with a heating filament.

The second PVD coating apparatus generating a comparatively less directed or non-directed vapor flux is one or more of the following coating apparatuses:
an ion source, in particular for the generation of carbon ions from a gaseous hydrocarbon supplied to the treatment chamber;
a plasma source, for example with a plasma generated from a microwave source, in particular a high-power microwave source.

A second way of satisfying the object underlying the application using a method of the kind initially mentioned is characterized in that at least a first PVD coating apparatus and a second PVC coating apparatus are used in the treatment chamber, in that the article or plurality of articles is arranged on the rotary support, in that the or each article is furthermore rotatable around its own axis on the rotary support and in that the rotary movement around the or each article's own axis and the rotary movement around the axis of rotation of the support are synchronized such that the first surface region is coated preferably by the first coating apparatus and the second surface region preferably by the second coating apparatus.

In this variant of the invention, one works mainly with two directed vapor fluxes: on the one hand of metal, B and/or Si atoms or ions and carbon which result in the formation of a carbide on the article, and on the other hand of carbon, with it being possible here to generate different carbon contents, and thus also the desired different coefficients of friction, on the first and second surface regions thanks to the special synchronization of the rotary movements of the article(s).

With a carefully selected procedure, it is possible to ensure that a multi-layer coating is formed on the second surface region; said multi-layer coating being described exactly in the simultaneously filed German patent application 10005614.8 with the title "A method for the manufacture of coatings and of an article", in which an extremely hard, wear-resistant and elastic surface with a low coefficient of friction can be generated.

The contents of this simultaneously filed application are also made part of the disclosure of the present application by way of the above reference.

The invention is described in more detail in the following with reference to embodiments with and to the drawings.

DESCRIPTION OF THE PREFERRED EMBODIMENTS

Figure 1:
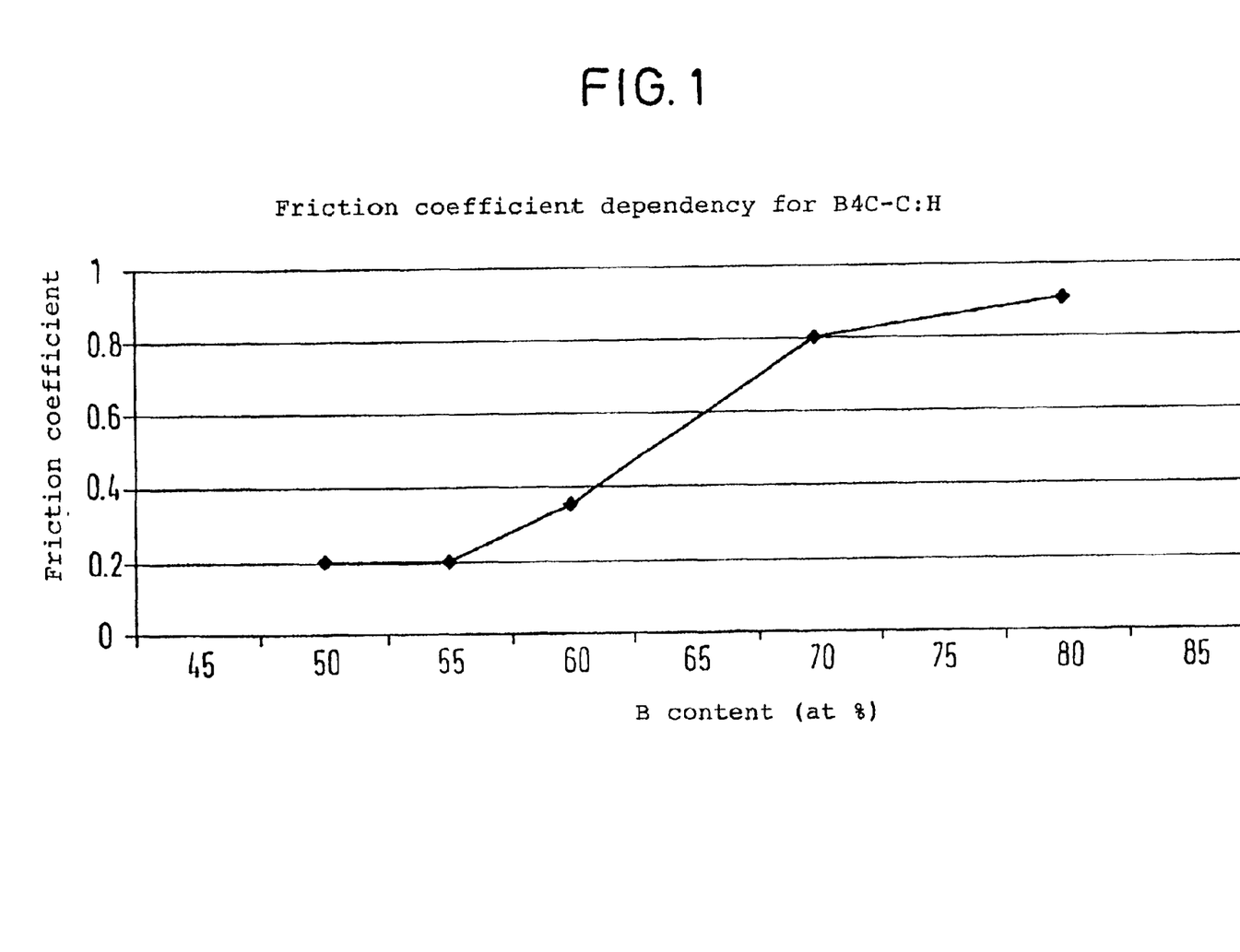
FIG. 1 is a graphical representation of the dependency of the friction coefficient of the composition $B_4C$—C:H as a function of the B content in at %.

With reference to FIG. 1, it can be seen that the coefficient of friction of a material with the composition $B_4C$—C:H has a high dependence on the boron content in at %. The lowest coefficient of friction of 0.2 is achieved with boron contents in the region between 50 and 55 at %, whereas with higher boron contents the coefficients of friction increase continuously up to a maximum value of 0.9 at 80 at % of boron. Similar curves can be recorded for all elements which can be considered for the present invention, namely B, Si, Ti, V, Cr, Zr, Nb, Mo, Hf, Ta and W. All of these elements form corresponding carbides and can be enriched with different proportions of carbon over a wide range in order to generate compositions which can be considered for the purpose of the present invention. Carbon atoms can also enter into bonds with hydrogen, with hydrogen as a rule resulting in a reduction in the coefficient of friction.

Figure 2:
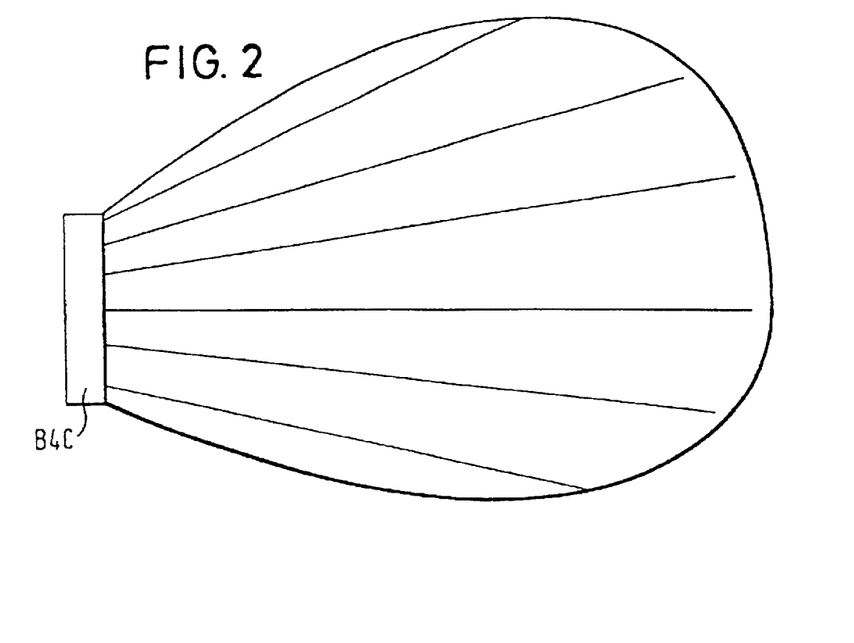
FIG. 2 is a representation of the usual vapor flux of a PVD coating apparatus with a comparatively directed vapor flux, for example from an arc discharge vaporization device or a cathode sputtering device.

FIG. 2 shows in schematic form the directional dependence of the vapor flux of a PVD coating apparatus with, in this example, a cathode of $B_4C$, in which the cathode is operated as part of an imbalanced magnetron. This distribution is generally known under the name of "cos $\phi$ distribution" and applies both to cathode sputtering processes and to arc discharge vaporization processes and substantially also for other directed PVD processes.

Figure 3:
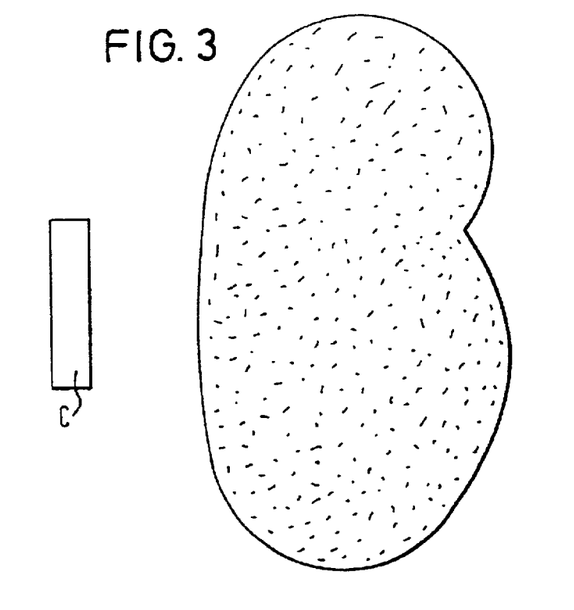
FIG. 3 is a representation of the vapor flux of a PVD coating apparatus with a comparatively less directed or non-directed vapor flux.

FIG. 3, in contrast, shows a carbon plasma which, in this example, is generated from a graphite target C and maintained in the plasma state by a high-power microwave source. The ions and atoms located in the region of the plasma have no preferred direction of flow here, but only stochastically distributed directions of movement so that they substantially form a uniform carbon distribution or carbon cloud.

Such a uniform distribution or a similar distribution which indeed has partially identically directed movements, but also movements of the ions and atoms in all directions, also results for other PVD coating apparatuses which are considered comparatively less directed or non-directed carbon sources for the purpose of the present invention.

Figure 4:
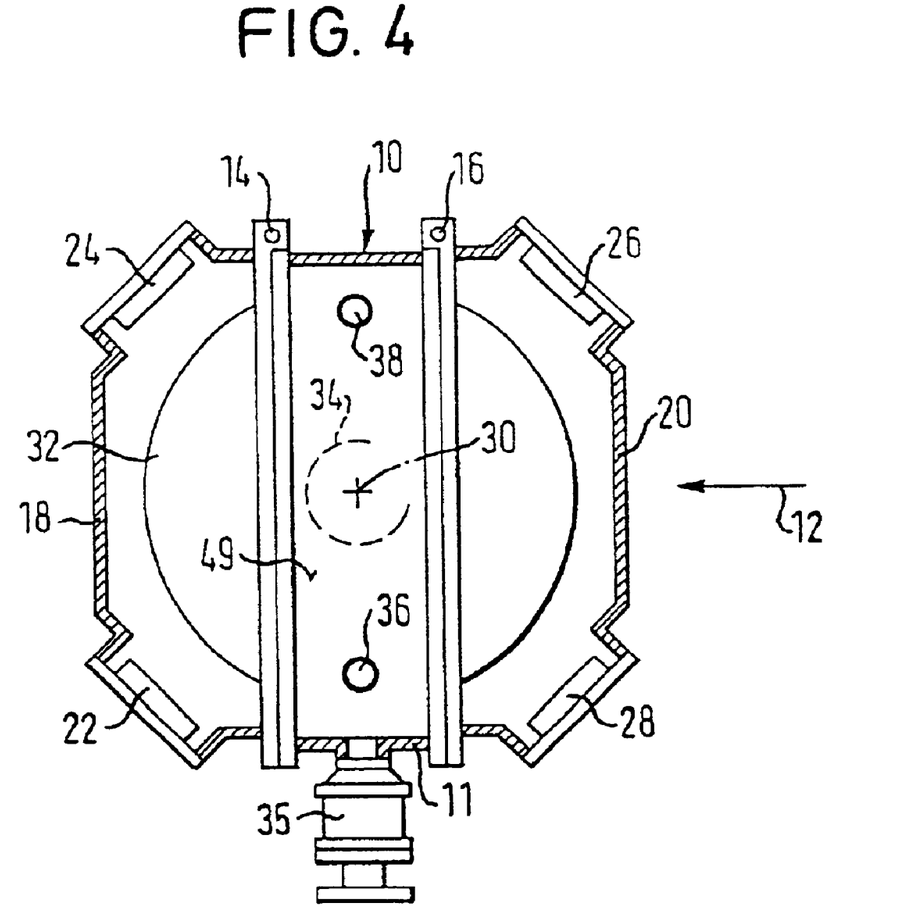
FIG. 4 is a schematic representation of a PVD coating apparatus known per se which is described in the European patent application with the publication number 0439561 and which is well-suited in a slightly modified form for the carrying out of the present method.

With reference to FIG. 4, a schematic representation of a PVD coating apparatus can be seen here which is designed in accordance with the European Patent 0 439 561 and which can be operated according to the examples given there. In this connection, reference is made to the publication "Surface and Coating Technology" Issue 50 (1992), pages 169 to 178, "A new method for hard coatings" by W. Münz, D. Schultze and F. G. M. Hauzer.

In the form shown in FIG. 4, the treatment chamber 10 has a middle housing part 11 which is at least substantially rectangular in a side view, i.e. in the direction of the arrow 12 of FIG. 4, and on which two chamber doors 18, 20 are provided on the left and right which can be rotated open and which are attached around respective vertical axes of rotation 14, 16.

Two targets 22, 24 and 26 and 28 respectively are installed in each of the chamber doors 18 and 20. The total structure in the closed state in accordance with FIG. 4 is substantially octagonal in cross-section. Each target 22 to 28 faces in the direction of the axis of rotation 30 of a support 32 which is rotatable around the axis of rotation in the direction of the arrow 34 (rotation in the opposite direction would also be feasible). The reference numeral 35 indicates a high-power vacuum pump which provides for the generation of the required vacuum in the treatment chamber in a manner known per se.

The reference numeral 36 indicates a feed stub for inert gas, for example argon, whereas the reference number 38 indicates a feed for a gas consisting of hydrocarbon.

Figure 5:
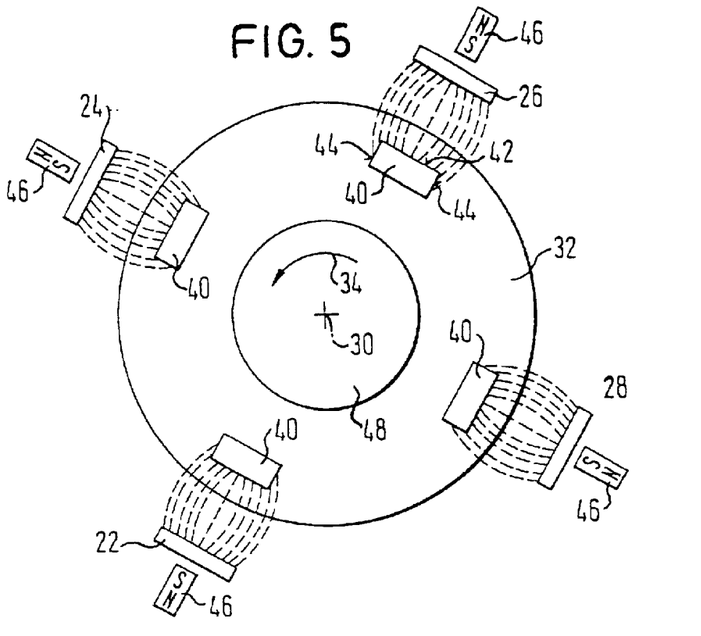
FIG. 5 is a schematic representation of a modified version of the apparatus in accordance with FIG. 4 for the carrying out of the first variant of the method in accordance with the invention.

In FIG. 5 and the subsequent FIGS. 6 to 11, for reasons of simplicity not only the rotary support 32 and individual targets 22 to 28 are shown, but also articles 40 to be coated and a plurality of different PVD coating apparatuses.

Each article 40 to be coated in the example of FIG. 5 and in the subsequent examples has a first surface region 42 which is to be provided with a coating with a comparatively high coefficient of friction and two side areas 44 which each form a second surface region and are intended to be coated with a coating which allows a low coefficient of friction.

It is understood that the articles 40 are shown here merely by way of example and that the articles to be coated do not have to have any special shape. They must only have at least two difference surface regions which should be provided with coatings of different coefficients of friction and for this purpose must lie spatially apart from one another, next to one another and/or at different angles to one another.

In FIG. 5, the four targets 22 to 28 consist of $B_4C$ and are operated here—as indicated by the permanent magnets 46—in a manner known per se in the arc discharge vaporization mode. In this way, a comparatively directed vapor flux in accordance with FIG. 2 is created so that, in this way, mainly the first surface region 42 of the four articles 40 shown are coated. However, coating is also effected on the side areas 44, this being, however, a thinner coating, since these side areas do not face the directed vapor flux.

The reference numeral 48 here indicates a carbon source, for example in the form of a graphite target, which is mounted on the upper wall 49 of the middle part 11 of the treatment chamber in accordance with FIG. 4 and which is operated either as an arc discharge vaporization device or a cathode sputtering device for the generation of a vapor flux, with the vapor flux being transformed by means of a high-power microwave source into an expanded carbon plasma (not shown) without directional dependence which surrounds the four articles 40.

Carbon is thus present uniformly on all surfaces of the article 40. This results in the manner indicated above in an increased carbon content on the side areas 44 and in a lower carbon content on the surface regions 42 of the article 40. In addition to this arrangement, a hydrocarbon gas, e.g. $C_2H_2$, is fed into the treatment chamber in a known manner via the feed 38. This gas is split into carbon and hydrogen as a result of the conditions prevailing in the chamber. The carbon can also be deposited on the articles 40. It is, however, also important that the hydrogen is partially incorporated into the coatings on the surfaces 42 and 44, namely in the carbon content present there. This hydrogen helps to lower the coefficient of friction in the areas 44 with a high carbon content.

Figure 6:
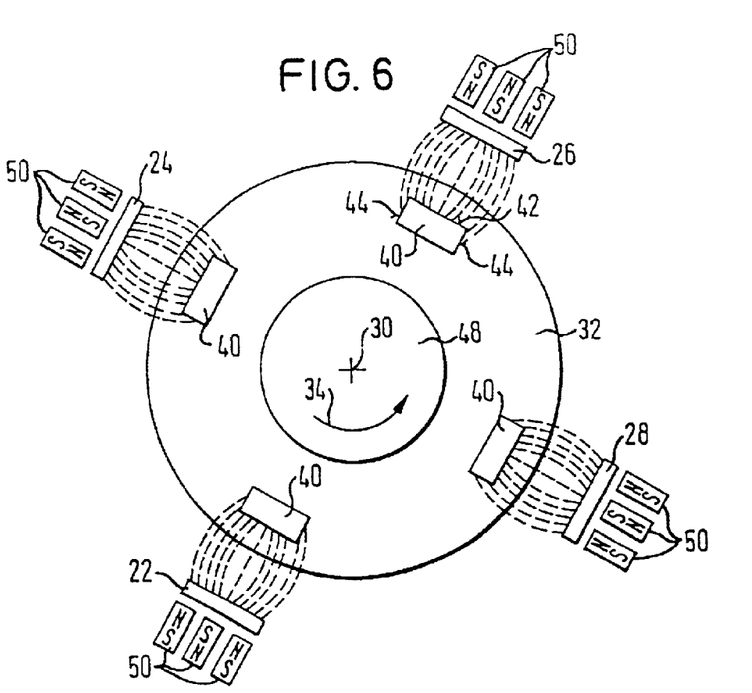
FIGS. 6, 7 and 8 show alternative embodiments of the apparatus in accordance with FIG. 4 for carrying out the first version of the method in accordance with the invention.

The arrangement in accordance with FIG. 6 corresponds to a great extent to the arrangement of FIG. 5, so that the same reference numerals are used for the same components and the same description applies for parts with the same reference numerals so that these parts are not described separately. This convention also applies to the further description. The only difference here to the arrangement in accordance with FIG. 5 is that the four targets of $B_4C$ are operated in a known manner as imbalanced magnetrons, which is represented by the different representation of the permanent magnets, here identified with the reference numeral 50.

It should be emphasized here, and also for the representation of FIG. 5, that the surface region 42 always has the given, at least substantially constant, effective orientation with respect to the vapor flux due to the simple rotation of the support 32 around the axis of rotation 30. Strictly speaking, the orientation is not constant, on the one hand due to the rotary movement of the support 32 and on the other hand because the vapor flux does not have a strictly parallel direction; however, such angular dependencies are without significance so that it is possible to speak of an at least substantially constant effective orientation. It is ensured by the rotary movement that a uniform coating is also created here. The rotary movement is also partially responsible for the side areas 44 coming into contact with the vapor flux at least at times so that a coating is also created here even if—as is wanted—this coating has a lesser thickness than the coating on the surface 42.

Although the carbon source 48 in the form of a graphite target is used in the examples in accordance with FIGS. 5 and 6, this source can be omitted and reliance can be placed on the hydrocarbon gas, for example $C_2H_2$, fed to the treatment chamber being split into carbon ions and carbon molecules as a result of the plasma created in front of each target 24 to 40, with these carbon ions and molecules then being taken up into the coating created on the articles 40 at least in part as a non-directed vapor flux or a less directed vapor flux.

It will be appreciated that a coating of the articles 40 in the embodiment in accordance with FIG. 5 and FIG. 6 would also be possible if no rotary movement were made because a certain coating on the side areas 44 would then also be achieved. The arrangement with the rotary movement 34 of the support 32 is, however, preferred.

Figure 7:
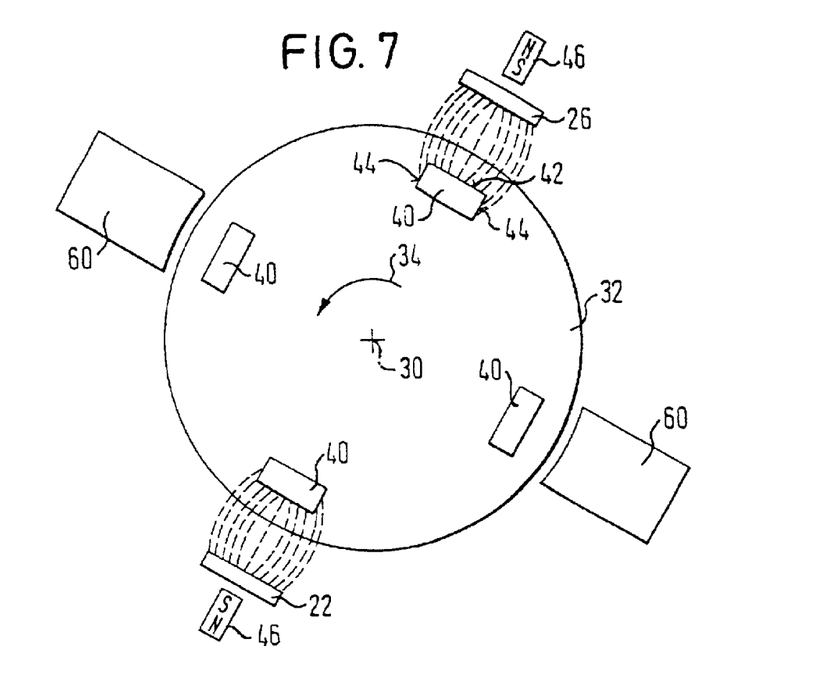

The same reference numerals are also used in the arrangement of FIG. 7 for components which can be found in FIG. 5. The same description as before applies. However, the difference in the representation of FIG. 7 is that the carbon source 48 on the upper wall 49 of the treatment chamber 10 is omitted here. Two ion sources 60 are provided in place of the previous targets 24 and 28 and these generate an at least substantially non-directed vapor flux or an undirected vapor flux of carbon ions and carbon atoms. The targets 26 and 22 are operated here in an arc discharge vaporization mode as is indicated by the magnets 46. The rotary movement 34 around the axis of rotation 30 is absolutely necessary here. As before, a thicker coating of $B_4C$ with a lower carbon content (optionally with incorporated hydrogen) is created on the first surface region 40 by this arrangement and a thinner coating with a higher carbon content (preferably with incorporated hydrogen) on the side areas 44.

Figure 8:
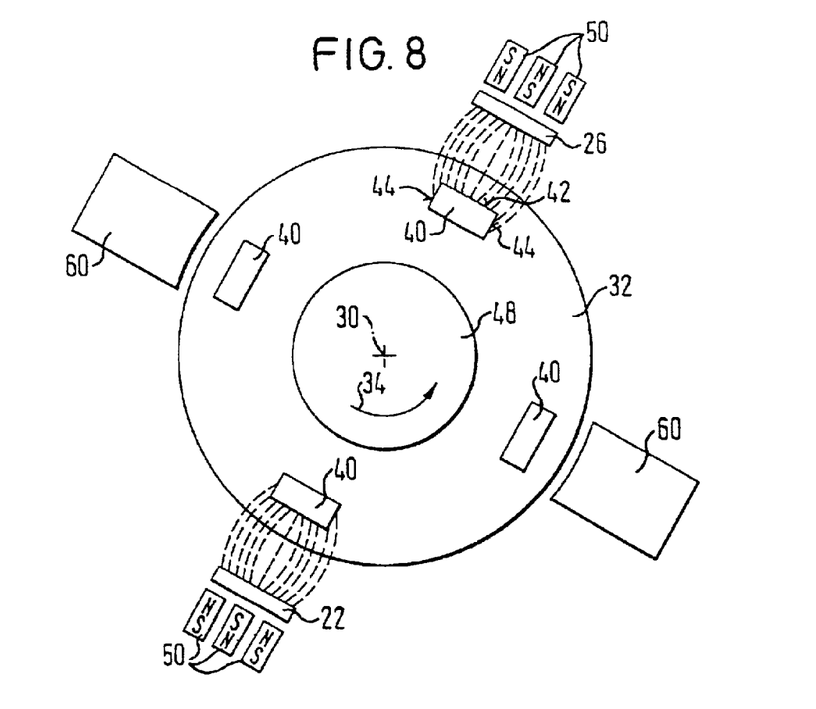

FIG. 8 shows an arrangement which is very similar to the arrangement in accordance with FIG. 7; only here the targets 26 and 22 are operated as imbalanced magnetrons, as is indicated by the arrangement of the permanent magnets 50. The reference numeral 48 in this figure shows that the carbon source of FIG. 5 can also be used as an option here, which would also be possible in principle with the embodiment of FIG. 7.

Figure 9:
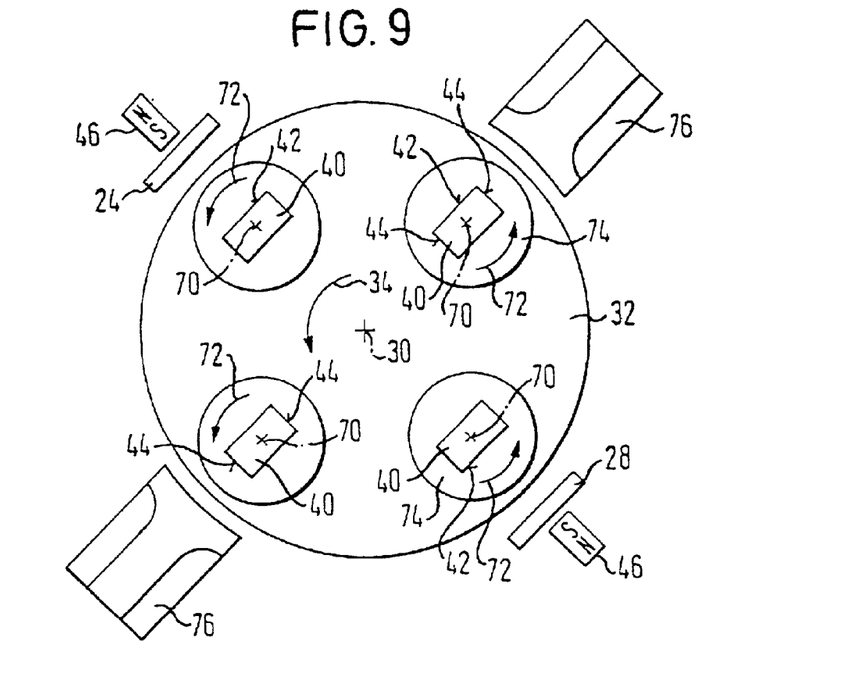
FIGS. 9–11 show three further embodiments of the apparatus of FIG. 4 for carrying out the second version of the method in accordance with the invention.

FIG. 9 shows a further embodiment where the articles 40 are rotatable not only on and with the rotary support 32 around the axis of rotation 30 in accordance with the arrow 34, but also around an axis of their own 70 in accordance with the arrows 72, which is realized by each article 40 being mounted on its own holder 74, with the holders 74 being rotatable with respect to the support 32 around the axis 70.

The reference numerals 24 and 28 here also—in accordance with the convention used for reference numerals—indicate targets made of $B_4C$ which are operated in the arc discharge vaporization mode, as indicated by the permanent magnets 46. The reference numbers 76 here indicate carbon ion sources which are, however, here made as linear, i.e. directed, ion sources.

FIG. 9, namely, shows a variant in which the coating in accordance with the invention can be generated on different surface regions 42 and 44 by the use of two directed PVD coating apparatuses. This generation of different coatings on the surface regions 42 and 44 requires the rotary movement of the articles 40 around their own axes 70 to be synchronized with the rotary movement of the support 32 around the axis of rotation 30, namely in the manner indicated in FIG. 9. It can namely be seen that the surface 42 always faces the two arc discharge vaporization sources 24 and 28 so that this surface region is preferably coated from the corresponding sources and a comparatively thinner coating is created on the side areas 44. The side areas 44, however, are preferably coated from the ion sources 76 due to their rotation around their own axes so that more carbon is supplied there and more carbon is incorporated into the coating.

Figure 10:
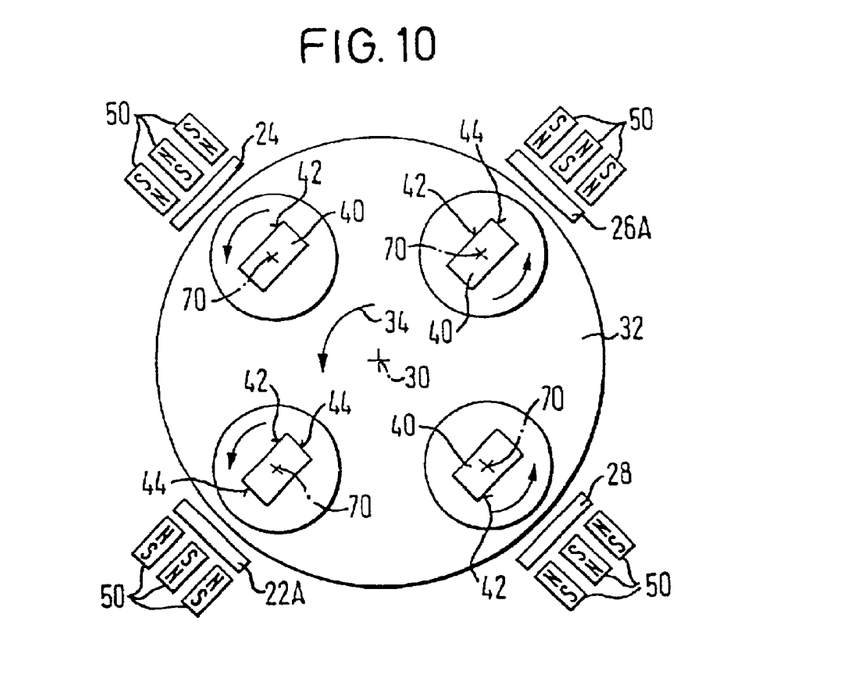

The embodiment of FIG. 10 is similar in principle, but four cathode sputtering sources are used here to generate the coating. The targets 24 and 28 consisting turn of $B_4C$, whereas the further targets 22A and 26A consist of graphite. That is, directed vapor fluxes are created at all four targets and indeed from carbon at the targets 22A and 26A and from $B_4C$ at the targets 24 and 28 so that the coating desired in accordance with the invention is also achieved by the synchronized rotation of the articles 40 around their own axes 70 and around the axis of rotation 30 on the support 32.

Figure 11:
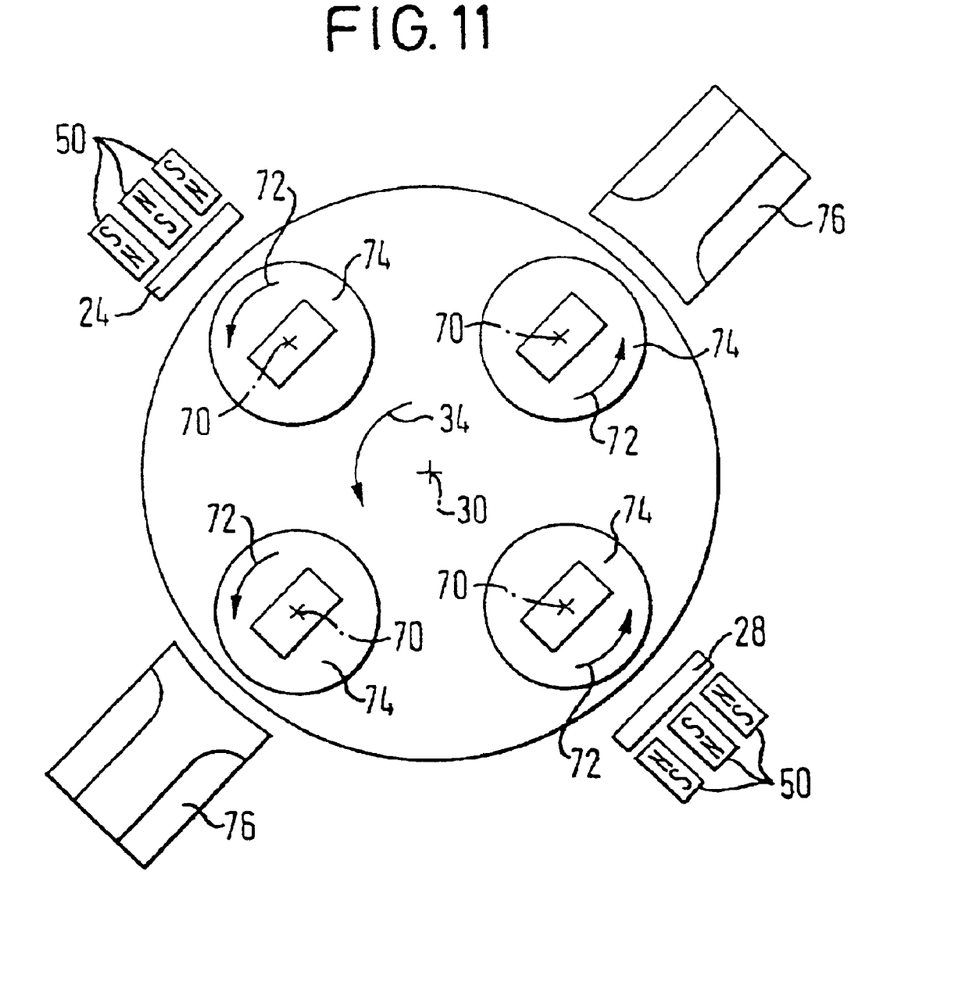

Finally, FIG. 11 shows that the same realization of the invention can be achieved if two corresponding cathode sputtering sources are used in place of the two arc discharge vaporization sources 24 and 28 in accordance with FIG. 9. In all embodiments, a hydrocarbon gas, preferably as $C_2H_2$, is preferably fed into the treatment chamber via the feed 38 in order thereby to mainly incorporate hydrogen into the carbon of the coating in order to further reduce the coefficient of friction in coatings with a higher carbon content.

Although all the preceding examples deal with a coating of $B_4C$, carbides of all the above-named elements can be considered instead of $B_4C$. In the event of $B_4C$ and Si, the corresponding targets 22 to 28 consist preferably of the carbide itself. This can also apply to the other elements.

However, it is also possible to form the carbides in the treatment chamber. For this purpose, corresponding quantities of carbon must be made available, which is best done if some targets consist of graphite. Optionally, additional targets can be used in free regions of the treatment chamber.

In the arrangement with synchronized rotary movements, there is also the possibility of forming coatings on the side areas 44 which consist of thin, alternating layers of, for example, WC and C, with the individual layer thicknesses of the carbides being in the range between 1 and 3 nm, and preferably approximately 2 nm, and the layer thickness of each carbon layer being in the range between approximately 1 nm and approximately 20 nm, preferably between 2 and 4 nm, with the first layer of the layer sequence preferably consisting of carbon and advantageously being somewhat thicker than the other layers, for example 500 nm.

In this embodiment, the carbon of the carbon layers is present with a comparatively high percentage of $sp_3$ bonds, i.e. diamond-like bonds, whereby on the one hand an extremely hard layer with a low coefficient of friction can be generated, but on the other hand also a layer which is elastic and therefore eminently suitable for bearing purposes. The alternating sequence of layers of WC and C is only given by way of example here. The other above-named elements can equally be considered. If the number of $sp_3$ bonds is put into relation with the number of $sp_2$ bonds, then this ratio (measured with conventional measurement methods such as Raman spectroscopy) is larger than 1.

Finally, it should be pointed out that it is advantageous to deposit the coating in accordance with the invention on a bonding layer of, for example, Cr or Ti.

The deposition of this Ti or Cr layer can be realized with the same treatment chamber in accordance with the invention. It is only necessary to provide a target made of the corresponding material, with such a target being able to be provided in addition to the said targets, for example in a free region of the chamber doors which can be swung open or in any other free regions within the middle part 11.

Figure 12:
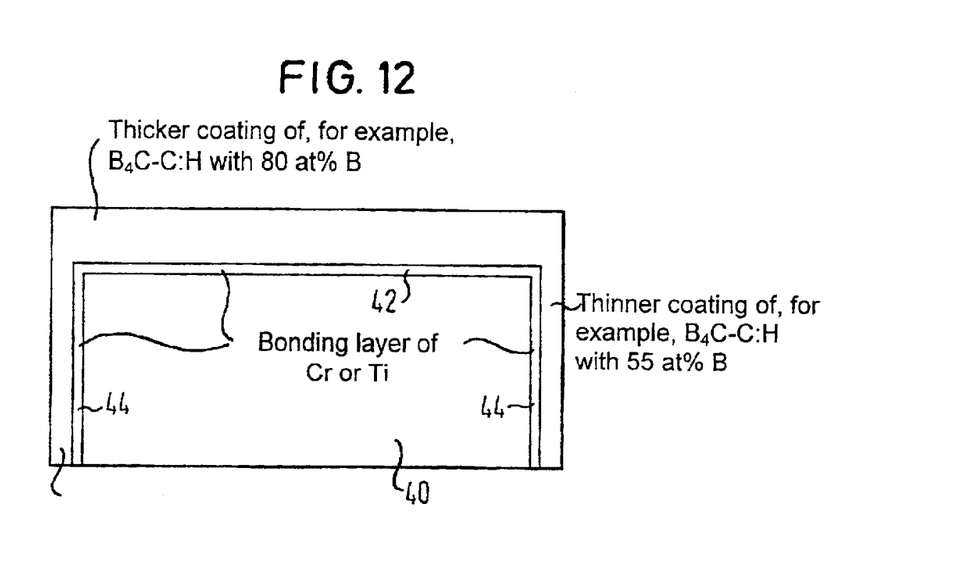
FIG. 12 and FIG. 13 are representations of two different coatings which can be generated with the method in accordance with the invention.
Figure 13:
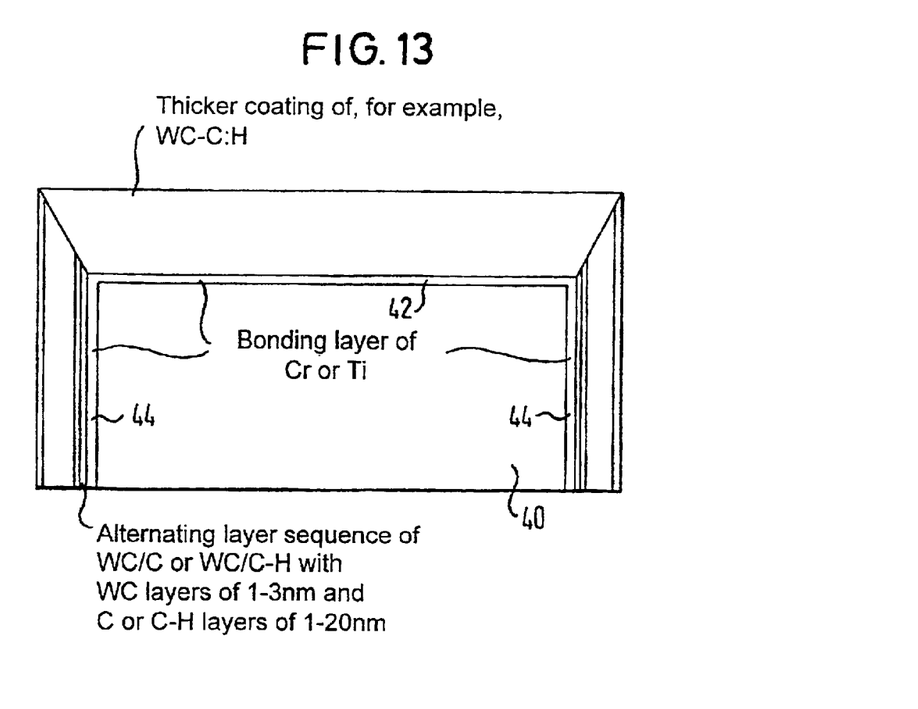

FIGS. 12 and 13 give examples for coatings generated with the method in accordance with the invention. They are naturally not shown true to scale, but serve only for a better understanding of the invention.

It should also be emphasized that the different examples given here are given purely by way of example. They are in no way to be understood as a final list of all possibilities serving the realization of the invention.

What is claimed is:

1. An article having first and second surface regions, a first layer provided on the first surface region and a second layer provided on the second surface region, each layer comprising a carbide of at least one element selected from the group comprising B, Si, Ti, V, Cr, Zr, Nb, Mo, Hf, Ta and W and the element carbon, the first layer having a relatively lower proportion of carbon and the second layer having a relatively higher proportion of carbon in comparison to the first layer, the second layer providing a first coefficient of friction at the second surface region lower than a second coefficient of friction provided by the first layer at the first surface region.

2. An article having first and second different surface regions, the first surface region being provided with a first layer and the second surface region being provided with a second layer, the first layer and the second layer each consisting of a carbide of one or more elements of the group comprising B, Si, Ti, V, Cr, Zr, Nb, Mo, Hf, Ta and W together with the element carbon, the first layer having a relatively lower proportion of carbon than the second layer in an amount selected to provide the first layer with a relatively high coefficient of friction, the second layer having a relatively higher proportion of carbon in comparison to the first layer in an amount selected to provide the second layer with a relatively low coefficient of friction.

3. An article in accordance with claim 2 wherein said one or more elements is boron, said first layer on said first surface region containing at least approximately 80 at % boron and a remainder containing 20 at % of carbon and incorporated hydrogen and unavoidable contaminants and said second layer on said second surface region containing approximately 55 at % boron and a remainder containing 45 at % of carbon and incorporated hydrogen and unavoidable contaminants.

4. An article in accordance with claim 2 wherein said one or more elements is tungsten, said first layer on said first surface region containing at least approximately 50 at % tungsten and a remainder containing 50 at % of carbon and incorporated hydrogen and unavoidable contaminants and said second layer on said second surface region containing approximately 15 at % tungsten and a remainder containing 85 at % of carbon and incorporated hydrogen and unavoidable contaminants.

5. An article in accordance with claim 2 including a bonding layer formed on the said first and second surface regions beneath said respective first and second layers.

6. An article in accordance with claim 5, wherein the bonding layer has a thickness in the range from about 0.1 $\mu$m to about 1 $\mu$m on said first and second surface regions.

7. An article in accordance with claim 5, wherein the bonding layer is a layer selected from the group comprising Cr and Ti.

8. An article in accordance with claim 5, wherein the first and second layers have a thickness on said first and second surface regions, including a thickness of said bonding layer, between about 1 $\mu$m and 5 $\mu$m.

9. An article method in accordance with claim 2, wherein the first and second layers have a thickness on said first and second surface regions between about 1 $\mu$m and 5 $\mu$m.

10. An article in accordance with claim 2, wherein the second layer is a multi-layer structure comprising alternate layers of a carbide of one or more of the said elements and carbon, a layer thickness of each carbon layer in the alternate layers being in the range between approximately 1 nm and approximately 20 nm.

11. An article in accordance with claim 10, wherein a thickness of each carbon layer is in the range from about 2 nm to 4 nm.

12. An article in accordance with claim 10, wherein the alternate layers comprise a topmost layer of carbon.

13. An article in accordance with claim 10, including a plurality of carbon layers, and wherein the topmost layer of carbon is thicker than other layers of carbon.

14. An article in accordance with claim 13, wherein the topmost layer of carbon has a thickness of approximately 500 nm.

15. An article in accordance with claim 10, wherein the carbon of the carbon layers has predominantly $sp_3$ bonds.

16. An article in accordance with claim 10, wherein each of said alternate layers of a carbide has a thickness in the range between about 1 and 3 nm.

17. An article in accordance with claim 16, wherein each of said alternate layers of a carbide has a thickness of about 2 nm.

18. An article in accordance with claim 2 wherein at least one of the first and second layers is a homogeneous layer.

\* \* \* \* \*